(12) United States Patent
Mobbs

(10) Patent No.: US 7,301,395 B2
(45) Date of Patent: Nov. 27, 2007

(54) DOHERTY AMPLIFIER

(75) Inventor: Christopher Ian Mobbs, Ilkley (GB)

(73) Assignee: Filtronic Compound Semiconductor, Ltd., Newtown Aycliffe, County Durham (GB)

( * ) Notice: Subject to any disclaimer, the term of this patent is extended or adjusted under 35 U.S.C. 154(b) by 0 days.

(21) Appl. No.: 10/594,289

(22) PCT Filed: Mar. 11, 2005

(86) PCT No.: PCT/GB2005/000942

§ 371 (c)(1),
(2), (4) Date: Feb. 8, 2007

(87) PCT Pub. No.: WO2005/088830

PCT Pub. Date: Sep. 22, 2005

(65) Prior Publication Data

US 2007/0205827 A1  Sep. 6, 2007

(30) Foreign Application Priority Data

Mar. 13, 2004 (GB) ................................. 0405724.6

(51) Int. Cl.
*H03F 3/68* (2006.01)
(52) U.S. Cl. ..................................... 330/124 R; 330/53
(58) Field of Classification Search ............ 330/124 R, 330/9, 53
See application file for complete search history.

(56) References Cited

U.S. PATENT DOCUMENTS 4,868,520 A  9/1989  Terakawa et al.

(Continued)

FOREIGN PATENT DOCUMENTS

EP  1041712  10/2000

(Continued)

OTHER PUBLICATIONS

Search Report from United Kingdom Patent Office dated Jul. 25, 2005.

(Continued)

*Primary Examiner*—Patricia Nguyen
(74) *Attorney, Agent, or Firm*—Howard & Howard Attorneys, P.C.

(57) ABSTRACT

A Doherty amplifier is described which comprises: a power splitter (120) having a first output and a second output, wherein the first output is connected to a main power splitter (392) having first and second outputs which differ in phase by 90°; and the second output is connected to an auxiliary power splitter (342) having first and second outputs which differ in phase by 90°; a main final stage amplifier (234) comprising first (324) and second (325) main paired amplifiers, the inputs of which are connected to the first and second outputs of the main power splitter (352); an auxiliary final stage amplifier (244) comprising first (344) and second auxiliary (345) paired amplifiers, the inputs of which are connected to the first and second outputs of the auxiliary power splitter (342); wherein the output from the first main paired amplifier (334) is connected to the output from the first auxiliary paired amplifier (344) by an impedance inverter (250); and the output from the second main paired amplifier (345) is connected to the output from the second auxiliary paired amplifier by an impedance inverter (251); the amplifier being arranged such that a relative phase shift is introduced to the signals input to the main and auxiliary power splitters to offset the phase shift of the impedance inverters.

17 Claims, 6 Drawing Sheets

U.S. PATENT DOCUMENTS

| | | |
|---|---|---|
| 5,012,200 A | 4/1991 | Meinzer |
| 5,786,727 A | 7/1998 | Sigmon |
| 5,974,041 A | 10/1999 | Kornfeld et al. |
| 6,653,896 B2 * | 11/2003 | Sevic et al. .................... 330/10 |
| 6,897,721 B2 * | 5/2005 | Hellberg ..................... 330/149 |
| 7,061,314 B2 * | 6/2006 | Kwon et al. ............ 330/124 R |
| 7,071,775 B2 * | 7/2006 | Gailus et al. ........... 330/124 R |
| 7,221,219 B2 * | 5/2007 | Hellberg et al. ........ 330/124 R |
| 2002/0039038 A1 | 4/2002 | Miyazawa |
| 2007/0008032 A1 * | 1/2007 | Kyu et al. .................... 330/51 |

FOREIGN PATENT DOCUMENTS

| | | |
|---|---|---|
| WO | 9826503 | 6/1998 |

OTHER PUBLICATIONS

PCT International Search Report dated Jul. 25, 2005, International Application No. PCT/GB2005/000942 and Written Opinion.

* cited by examiner

DOHERTY AMPLIFIER

The subject patent application claims priority to and all the benefits of International Application No. PCT/GB2005/000942, which was filed on 11 Mar. 2005 with the World Intellectual Property Organization.

The present invention relates to a Doherty amplifier. More particularly, but not exclusively, the present invention relates to a Doherty amplifier having reduced inter-stage reflection ripple within the amplifier.

BACKGROUND

In the 1930s a high efficiency, linear, valve based power amplifier was devised by W. H. Doherty. This 'Doherty' amplifier configuration consisted of two valve amplifiers, namely the main amplifier and the auxiliary amplifiers, which delivered power into a common load in a very efficient manner. More recently, the Doherty amplifier has been realised with semiconductor transistor amplifiers replacing the valve amplifiers.

Amplifier efficiency $\eta$ is the proportion of the DC power $P_{DC}$ supplied to the amplifier network relative to the available RF power $P_{RF}$ at the output of the amplifier network that is then delivered to the load. I.e. $\eta = P_{RF}/P_{DC}$.

One problem associated with the Doherty design is the sensitivity to operating frequency. The individual amplifiers within the Doherty amplifier have input and output matches which alter with varying power level. This variation generates mismatches. These mismatches cause ripple within the transmission path of the amplifier and reduce the frequency flatness of the design.

The standard Doherty amplifier is more efficient than a conventional amplifier but can be difficult to optimise.

The present invention comprises a Doherty amplifier comprising:
- a power splitter having a first output and a second output, wherein
  - the first output is connected to a main power splitter having first and second outputs which differ in phase by 90°; and
  - the second output is connected to an auxiliary power splitter having first and second outputs which differ in phase by 90°;
- a main final stage amplifier comprising first and second main paired amplifiers, the inputs of which are connected to the first and second outputs of the main power splitter;
- an auxiliary final stage amplifier comprising first and second auxiliary paired amplifiers, the inputs of which are connected to the first and second outputs of the auxiliary power splitter; wherein
  - the output from the first main paired amplifier is connected to the output from the first auxiliary paired amplifier by an impedance inverter; and
  - the output from the second main paired amplifier is connected to the output from the second auxiliary paired amplifier by an impedance inverter;
- the amplifier being arranged such that a relative phase shift is introduced to the signals input to the main and auxiliary power splitters to offset the phase shift of the impedance inverters.

The Doherty amplifier of the invention has the advantage of improved frequency flatness and stability.

Preferably, the amplifier further comprises:
- a main driver amplifier connected between the first output of the power splitter and the input of the main power splitter; and
- an auxiliary driver amplifier connected between the second output of the power splitter and the input of the auxiliary power splitter.

Preferably, the phase of the second outputs of the main and auxiliary power splitters lead the phases of the corresponding first outputs of these splitters.

Preferably, the phases of the second outputs of the main and auxiliary power splitters lag behind the phases of the corresponding first outputs of these splitters.

Preferably, the power splitter introduces a phase shift between the first and second outputs to offset the phase shift of the impedance inverters.

Preferably, at least one of the main driver amplifier and auxiliary driver amplifier introduce a relative phase shift to the input of the corresponding main or auxiliary power splitter to offset the shift of the impedance inverters.

Preferably, the Doherty amplifier further comprises a combiner having a first input port connected to the output of the first auxiliary amplifier and a second input port connected to the output of the second auxiliary amplifier,
- the combiner being adapted to introduce a phase change between the signals received at the first and second input ports opposite to the phase change introduced by the auxiliary power splitter and to combine these two signals at an output port.

More preferably, the phase change is 90°.

The Doherty amplifier can comprise a load connected to the output of the combiner via a further impedance transformer. The load can then terminate differential signals.

Alternatively, the Doherty amplifier can further comprise:
- a load connected to the output of the combiner;
- a first combiner impedance transformer connected between the first auxiliary amplifier and the first input port of the combiner; and
- a second combiner impedance transformer connected between the second auxiliary amplifier and the second input port of the combiner.

At least one of the main driver amplifier and auxiliary driver amplifier can be single ended.

At least one of the main driver amplifier and auxiliary driver amplifier can comprise a pair of balanced amplifiers.

The Doherty amplifier can comprise a plurality of main driver amplifiers connected in cascade before the main power splitter.

The Doherty amplifier can comprise a plurality of auxiliary driver amplifiers connected in cascade before the auxiliary power splitter.

According to a further aspect of the present invention, there is provided a method of amplifying a signal, the method comprising:
- splitting the input signal into a main signal and an auxiliary signal;
- splitting the main signal into a first main signal and second main signal which differ in phase by 90°;
- splitting the auxiliary signal into a first auxiliary signal and a second auxiliary signal which differ in phase by 90°;
- amplifying the first main signal and the second main signal;
- amplifying the first auxiliary signal and the second auxiliary signal;
- inverting the impedance of the amplified first main signal;
- adding the impedance inverted amplified first main signal to the amplified first auxiliary signal thereby creating a first added signal;
- inverting the impedance of the amplified second main signal adding the impedance inverted amplified second main signal to the amplified second auxiliary signal thereby creating a second added signal;

wherein a relative phase shift is introduced to the signals during said steps of splitting to offset the effect of said steps of inverting.

Preferably, the method can further comprise:

amplifying the main signal prior to said step of splitting the main signal;

amplifying the auxiliary signal prior to said step of splitting the auxiliary signal;

Preferably, the method can further comprise:

combining the first and second added signals by introducing a phase change between the first and second added signals opposite to the phase change introduced during said step of splitting the auxiliary signal.

The present invention will now be described, by way of example only and not in any limitative sense, with reference to the accompanying drawings in which.

Figure 1:
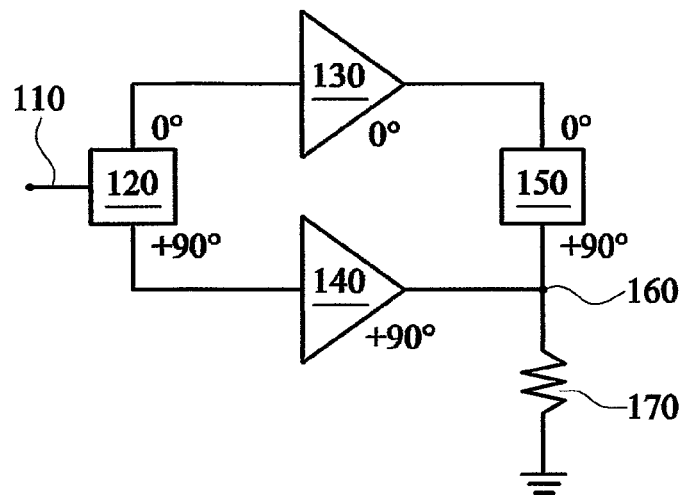
FIG. 1 shows a schematic block diagram of a Doherty amplifier.

Similar items or blocks in different figures share common reference numerals unless indicated otherwise.

FIG. 1 shows a schematic of the block diagram of a 'Doherty' amplifier. The amplifier consists of a main amplifier (130), an auxiliary amplifier (140), an impedance inverter (150), an input power divider (120), a common input junction (110), a common output junction (160) and a load (170).

The input power divider (120) splits the signal so that part of the signal is passed along the main amplifier (130) path and so that the other part of the signal is passed along the auxiliary amplifier (140) path. The input power divider (120) may have any differential phase between its two outputs but additional phase shifters are required to ensure that the signal at the input of the auxiliary amplifier (140) is delayed relative to the signal at the input of the main amplifier (130) by 90°.

The two amplifiers (130 and 140) are designed to have the same phase performance as each other. Subsequently, the phase delay from the splitter (120) is maintained through the amplifiers (130 and 140) and the signal at the output of the auxiliary amplifier (140) is still delayed relative to the signal at the output of the main amplifier (130). The RF out of the main amplifier (130) then passes through the impedance inverter (150). The circuit is configured so that the delay added to the auxiliary path from the splitter (120) is the same as the delay in the impedance inverter (150). The two signals are therefore coherent again when they recombine at the common junction (160).

Figure 2:
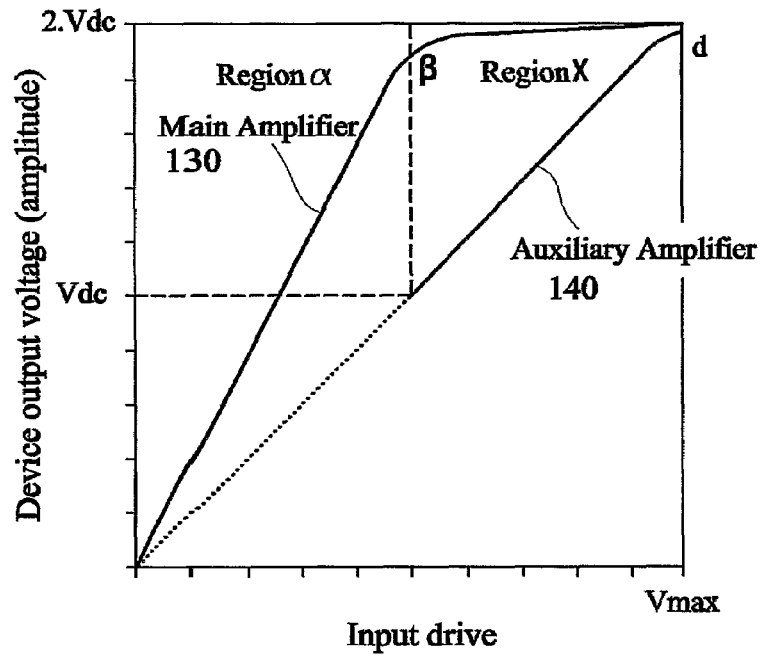
FIG. 2 shows a theoretical plot of output voltage from each device versus input drive for a Doherty amplifier.

The main amplifier (130) is configured as class B or class AB. As the input RF drive power increases the main amplifier (130) turns on and the output power steadily increases as shown in FIG. 2 (region α). The auxiliary amplifier (140) is biased class C so it initially stays turned off and is effectively an open circuit. At breakpoint β the main amplifier (130) is operating at its maximum efficiency, and the output RF voltage has reached its maximum; twice the DC supply voltage. However, the maximum output power from the main amplifier (130) at breakpoint β is a fraction of its actual saturated output power capability; typically around 50%.

The Doherty amplifier is configured so that as the input drive level is increased beyond breakpoint β, into region χ, the auxiliary amplifier (140) starts to turn on. This injects more current through the load (170) and increases the impedance seen at the common junction (160). Because of the impedance inverter (150) the impedance at the common junction (160) is inverted and the main amplifier (130) actually starts to see a reduction its load impedance. This dynamically decreasing load impedance lets the main amplifier (130) output more current without degrading or decreasing the voltage output characteristic. The output power out of the main amplifier (130) therefore increases while the efficiency of the main amplifier (130) is maintained at its maximum. The main amplifier (130) operates at its maximum efficiency in all of region χ.

Figure 3:
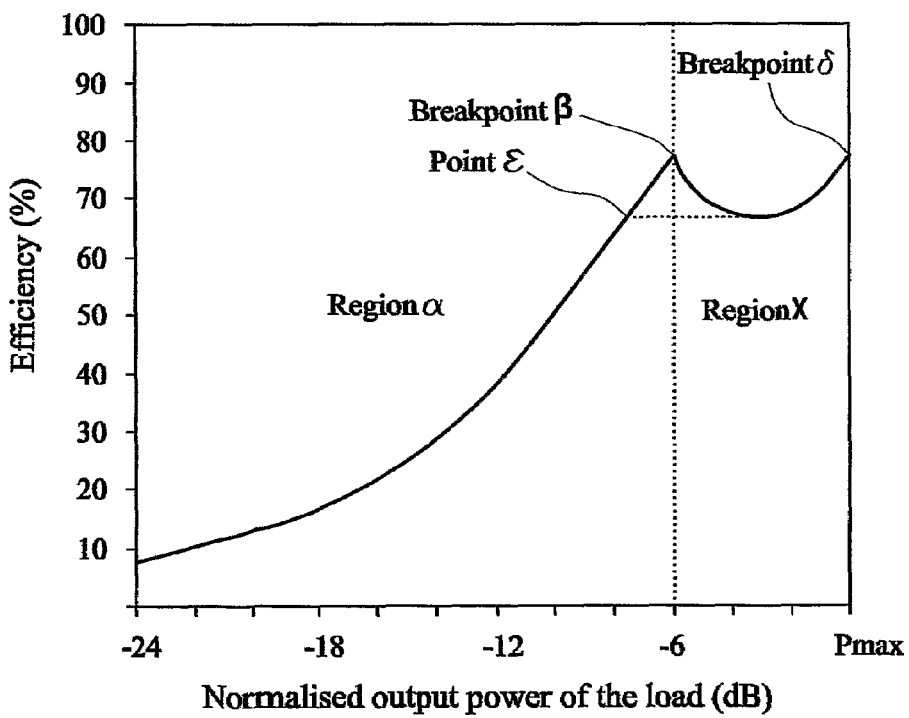
FIG. 3 shows a plot of theoretical efficiency versus output power for a Doherty amplifier.

Initially, the auxiliary amplifier (140) will not have the maximum RF voltage swing at its output for it to be fully efficient itself. Therefore, the composite efficiency, of both the main amplifier (130) and the auxiliary amplifier (140) dips slightly before it reaches the maximum as shown in FIG. 3. At point δ, the input drive has increased sufficiently so that the auxiliary amplifier (140) also operates at maximum efficiency and the output RF voltage amplitude has also reached its maximum; twice the DC supply voltage.

The advantage of this Doherty amplifier network is that it operates linearly, at high efficiency, over a wider range of output power levels than that of a standard power amplifier. i.e. it is linear and efficient between point ε and δ, rather than just between point ε and breakpoint β. The maximum efficiency range is dependant on the value of the impedance inverter (150) and the power capability ratio of the main amplifier (130) to the auxiliary amplifier (140).

Figure 4:
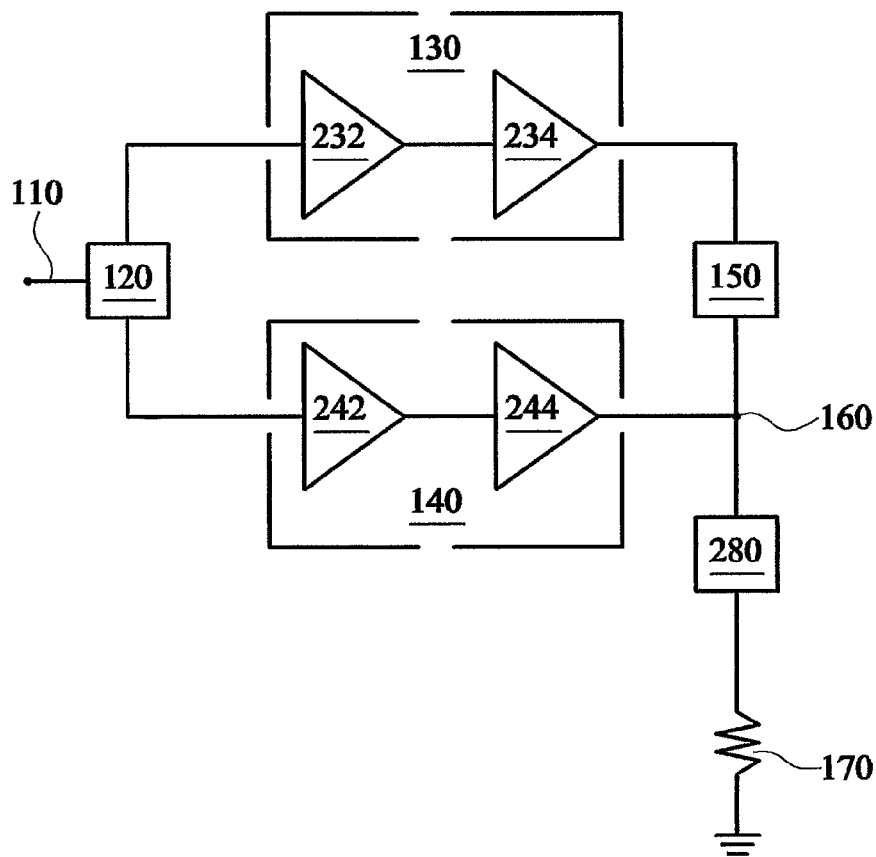
FIG. 4 shows a schematic block diagram of the embodiment of FIG. 1 in further detail.

FIG. 4 illustrates the Doherty amplifier of FIG. 1 in further detail. The main amplifier (130) comprises two cascaded amplifiers (232 and 234) and the auxiliary amplifier (140) comprises two cascaded amplifiers (242 and 244). Amplifier 232 is the 'main driver amplifier' and is configured as class B or similar. Amplifier 234 is the 'main final stage amplifier' and is configured as class B or similar. Amplifier 242 is the 'auxiliary driver amplifier' and is configured as class C or similar. Amplifier 244 is the 'auxiliary final stage amplifier' and is is configured as class C or similar.

The two-stage amplifier allows the network to be biased as per the standard Doherty network, i.e. with a class B main driver amplifier (232) and a class C auxiliary driver amplifier (242) but also allows the addition of two final stage amplifiers (234 and 244) that have better RF performance.

In this embodiment, the two final amplifiers (234 and 244) are class F. Class F amplifiers are more efficient than either of the class B or class C configurations as less power is lost within the transistor. In addition integral harmonic filtering at the output of the class F amplifier results in optimising the Doherty load-pulling effect. However, in alternative embodiments the two final amplifiers may be other than class F.

An impedance transformer (280) is added between the load (170) and the common port (160) so that the output impedance of the system can be reduced allowing the transmission lines to be realised as wider Microstrip lines that can then operate under higher power conditions. In an alternative embodiment, the impedance inverter (280) is omitted.

The main amplifier (130) and the auxiliary amplifier (140) in the Doherty amplifier have input matches that change with power level. The amplifiers are biased close to cut-off and have a non-linear input impedance over approximately half of the RF signal incident at their input. The impedance of the input of each amplifier varies with the voltage applied. This changing input impedance can introduce variable reflections within the transmission path resulting in frequency ripples and stability problems.

The performance of a Doherty amplifier can be improved by configuring the two driver circuits (232 and 242) as balanced amplifiers (not shown). This improves the input and output match of both of the amplifiers (232 and 242) reducing the reflections and the ripple within the transmission path. The driver amplifiers (232 and 242) are still not isolated from the poor input match of the final stage amplifiers (234 and 244) that they precede so reflection and ripple are not eliminated.

Configuring the final stage amplifiers (234 and 244) as standard balanced amplifiers does not solve this problem. The final combiner on the output of the main final stage amplifier (234) would effectively isolate it from the dynamic inverted output impedance of the auxiliary final stage amplifier (244). The advantage that the Doherty design provides in scaling the load impedance seen by the main amplifier (130) would be lost.

Figure 5:
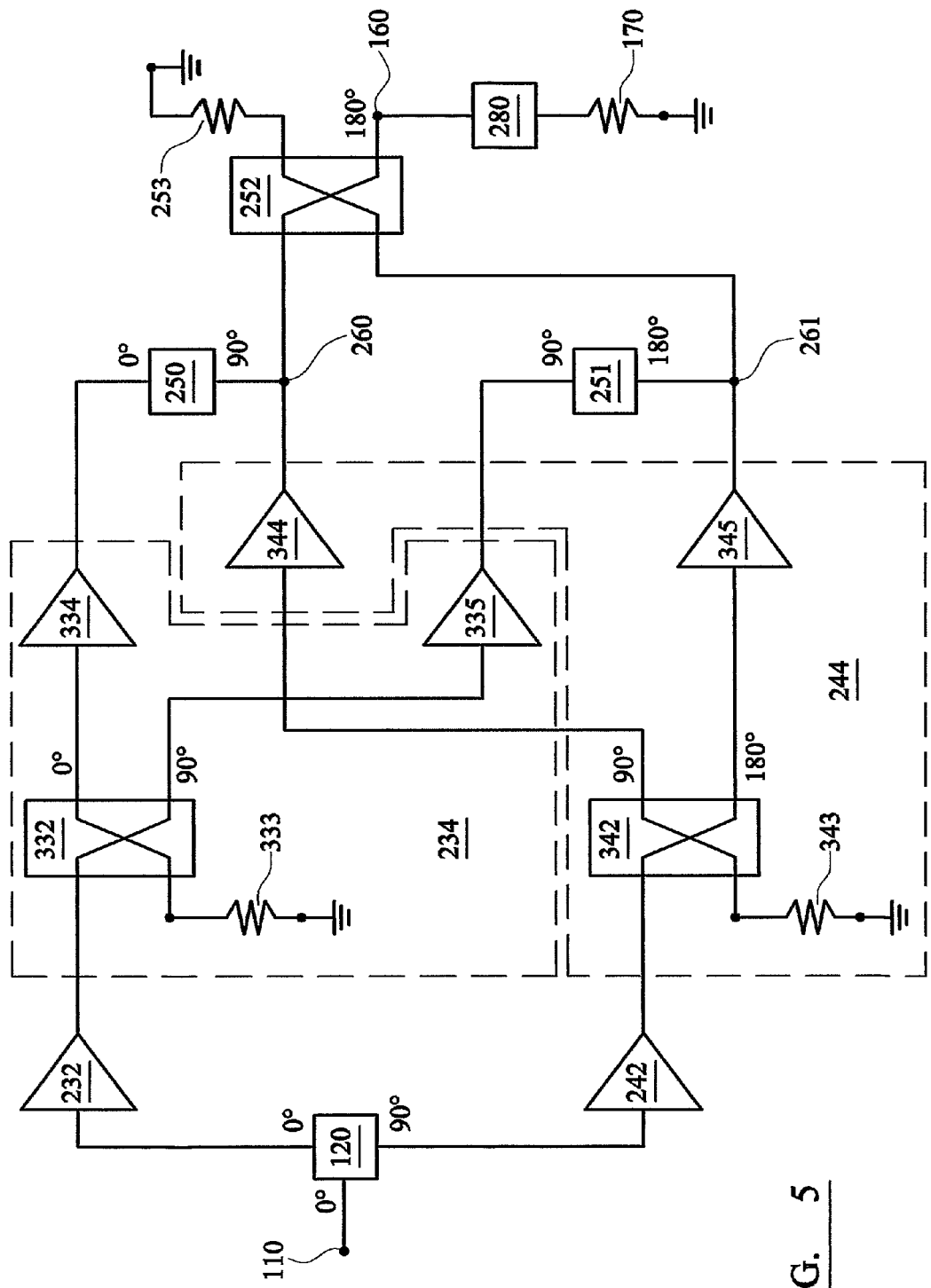
FIG. 5 shows a schematic block diagram of a Doherty amplifier according to the invention.

Shown in FIG. 5 is a Doherty amplifier according to the invention. The driver amplifiers (232 and 242) are balanced or single ended as shown in FIGS. 4 and 5. The main final stage amplifier (234) comprises first and second main paired amplifiers (334 and 335) that are fed from a main power splitter (332). The auxiliary final stage amplifier (244) comprises first and second auxiliary paired amplifiers (344 and 345) that are fed from an auxiliary power splitter (342). The power splitters (332 and 342) comprise two outputs substantially 90° different in phase and equal in amplitude.

Reflections from both pairs of amplifiers (334 with 335 and 344 with 345) travel back through their associated power splitter (332 or 342 respectively). At the common input of the splitters the two reflected signal are out of phase by 180° and cancel each other out. At the terminated port of each splitter the pair of reflected signals are in phase and add together. They are then dissipated in the associated load resistor (333 or 343, respectively).

The outputs from the four amplifiers (334, 344, 335 and 345) are then paired so that they can be configured in the same way as in a known Doherty amplifier. That is each main amplifier (334 or 335) output is then connected on a corresponding auxiliary amplifier (344 or 345) output via a respective impedance inverter (250, 251). The circuitry before the amplifiers must maintain the phase offset required that ensures that the phase of each auxiliary amplifier (344 or 345) output must be delayed relative to the main amplifier (334 or 335) output that it is paired with, in order to compensate for the phase offset of the impedance inverters (250 and 251) that they later recombine through. Both main amplifiers (334 and 335) now continue to see an effective reduction in load impedance as the auxiliary amplifiers (344 and 345) turn on. The output powers, of both main amplifiers (334 and 335), increase with increased input power, while their efficiency is maintained.

The balancing configuration of the final stage amplifiers (234 and 244) is then completed using a combiner (252) after the common points (260 and 261), just prior to the last impedance transformer (280) and the load (170).

The combiner comprises first and second input ports and a output port. The combiner introduces a phase difference between the signals received at the input ports before combining them at the output port. The phase difference is opposite to that of the phase difference introduced by the auxiliary power splitter, ie −90° in this embodiment.

Figure 6:
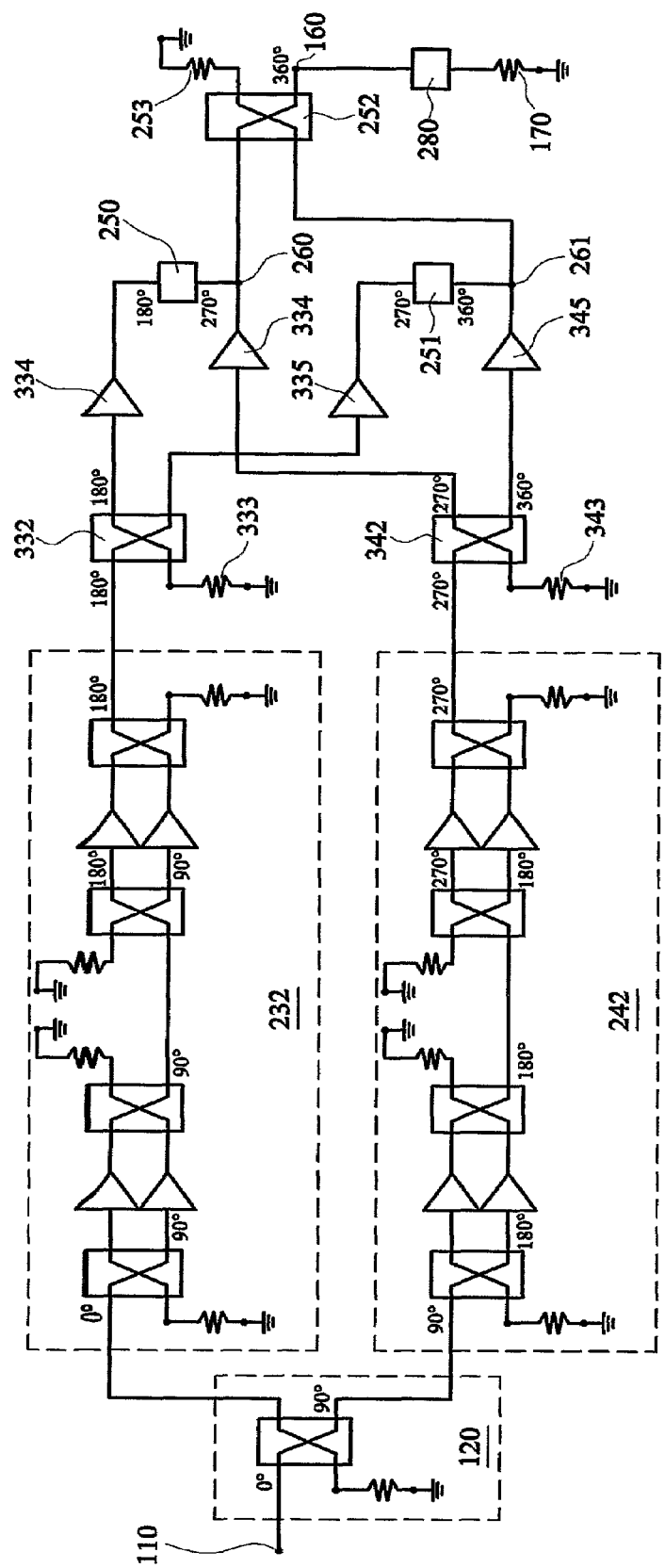
FIG. 6 shows a schematic block diagram of a further embodiment of the invention.

Shown in FIG. 6 is a further embodiment of a Doherty amplifier according to the invention. The principle of operation is similar to that of FIG. 5 except the driver amplifiers (232 and 242) comprise balanced pairs of amplifiers. The outputs of the amplifiers are connected to 90° power splitters as shown to reduce reflections between these amplifiers.

The output from the main and auxiliary driven amplifiers are connected to the main and auxiliary power splitters as previously described.

Figure 7:
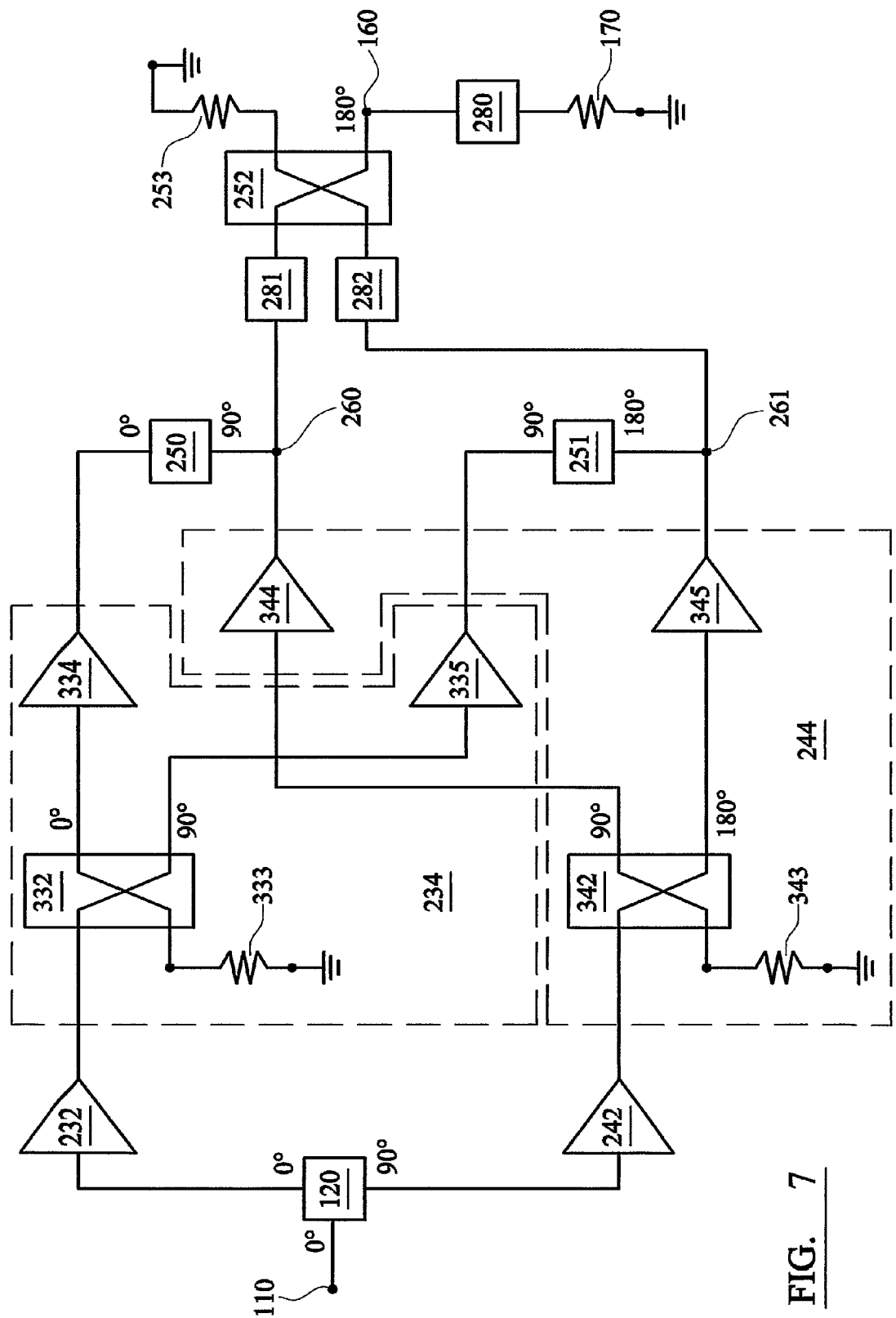
FIG. 7 shows a schematic block diagram of a further embodiment of the invention.
Figure 8:
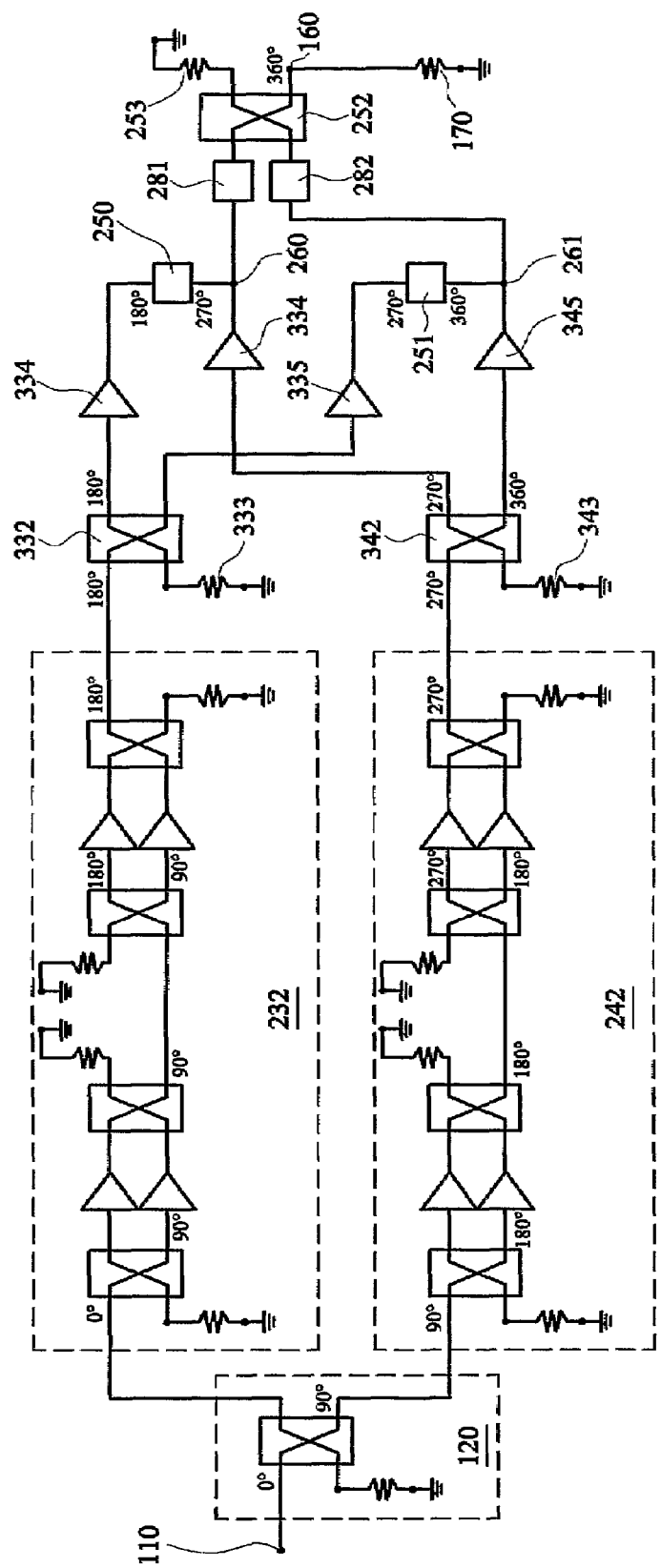
FIG. 8 shows a schematic block diagram of a further embodiment of the invention.

Two further embodiments are depicted in FIGS. 7 and 8, respectively. In these embodiments an impedance transformer 281 is connected in the main signal path immediately before the combiner 252, between the common node 260 connecting the main amplifier 334 and auxiliary amplifier 344 and the combiner 252. A corresponding impedance transformer 282 is connected in the auxiliary signal path immediately before the combiner 252, between the common node 261 connecting the main amplifier 335 and auxiliary amplifier 345 and the combiner 252.

The power splitter of these embodiments is a 3 dB coupler.

The transistors of these embodiments are GaAs transistors. In other embodiments the transistors can be silicon LDMOS, GaN and SiC. Any transistor technology is suitable provided the auxiliary amplifier (140) can appear as an approximate open circuit when it switches off.

In these embodiments the impedance inverters (150 and 280) are implemented as microstrip transmission lines. Inverter (150) is 38Ω and inverter (280) is 30.86Ω. Other formats and values are possible as the above values are specific to the embodiment described.

Surface mount stripline couplers are used as splitter/combiner elements. Again, other formats are possible.

The invention claimed is:

1. A Doherty amplifier comprising:
a power splitter having a first output and a second output, wherein the first output is connected to a main power splitter having first and second outputs which differ in phase by 90°; and
the second output is connected to an auxiliary power splitter having first and second outputs which differ in phase by 90°;
a main final stage amplifier comprising first and second main paired amplifiers, the inputs of which are connected to the first and second outputs of the main power splitter;
an auxiliary final stage amplifier comprising first and second auxiliary paired amplifiers, the inputs of which are connected to the first and second outputs of the auxiliary power splitter;
wherein the output from the first main paired amplifier is connected to the output from the first auxiliary paired amplifier by an impedance inverter; and
the output from the second main paired amplifier is connected to the output from the second auxiliary paired amplifier by an impedance inverter;

the amplifier being arranged such that a relative phase shift is introduced to the signals input to the main and auxiliary power splitters to offset the phase shift of the impedance inverters.

2. A Doherty amplifier as claimed in claim 1, further comprising:
a main driver amplifier connected between the first output of the power splitter and the input of the main power splitter; and
an auxiliary driver amplifier connected between the second output of the power splitter and the input of the auxiliary power splitter.

3. A Doherty amplifier as claimed in claim 1, wherein the phase of the second outputs of the main and auxiliary power splitters lead the phases of the corresponding first outputs of these splitters.

4. A Doherty amplifier as claimed in claim 1, wherein the phases of the second outputs of the main and auxiliary power splitters lag behind the phases of the corresponding first outputs of these splitters.

5. A Doherty amplifier as claimed in claim 1, wherein the power splitter introduces a phase shift between the first and second outputs to offset the phase shift of the impedance inverters.

6. A Doherty amplifier as claimed in claim 2, wherein at least one of the main driver amplifier and auxiliary driver amplifier introduce a relative phase shift to the input of the corresponding main or auxiliary power splitter to offset the shift of the impedance inverters.

7. A Doherty amplifier as claimed in claim 1, further comprising a combiner having a first input port connected to the output of the first auxiliary amplifier and a second input port connected to the output of the second auxiliary amplifier, the combiner being adapted to introduce a phase change between the signals received at the first and second input ports opposite to the phase change introduced by the auxiliary power splitter and to combine these two signals at an output port.

8. A Doherty amplifier as claimed in claim 7, wherein the phase change is 90°.

9. A Doherty amplifier as claimed in claim 6, further comprising a load connected to the output of the combiner via a further impedance transformer.

10. A Doherty amplifier as claimed in claim 6, further comprising:
a load connected to the output of the combiner;
a first combiner impedance transformer connected between the first auxiliary amplifier and the first input port of the combiner; and
a second combiner impedance transformer connected between the second auxiliary amplifier and the second input port of the combiner.

11. A Doherty amplifier as claimed in claim 2, wherein at least one of the main driver amplifier and auxiliary driver amplifier are single ended.

12. A Doherty amplifier as claimed in claim 2, wherein at least one of the main driver amplifier and auxiliary driver amplifier comprise a pair of balanced amplifiers.

13. A Doherty amplifier as claimed in claim 2, comprising a plurality of main driver amplifiers connected in cascade before the main power splitter.

14. A Doherty amplifier as claimed in claim 2, comprising a plurality of auxiliary driver amplifiers connected in cascade before the auxiliary power splitter.

15. A method of amplifying an input signal, the method comprising:
splitting the input signal into a main signal and an auxiliary signal;
splitting the main signal into a first main signal and second main signal which differ in phase by 90°;
splitting the auxiliary signal into a first auxiliary signal and a second auxiliary signal which differ in phase by 90°;
amplifying the first main signal and the second main signal;
amplifying the first auxiliary signal and the second auxiliary signal;
inverting the impedance of the amplified first main signal;
adding the impedance inverted amplified first main signal to the amplified first auxiliary signal thereby creating a first added signal;
inverting the impedance of the amplified second main signal;
adding the impedance inverted amplified second main signal to the amplified second auxiliary signal thereby creating a second added signal;
wherein a relative phase shift is introduced to the signals during said steps of splitting to offset the phase shift of said steps of inverting.

16. A method according to claim 15, further comprising:
amplifying the main signal prior to said step of splitting the main signal; and
amplifying the auxiliary signal prior to said step of splitting the auxiliary signal.

17. A method according to claim 15, further comprising:
combining the first and second added signals by introducing a phase change between the first and second added signals opposite to the phase change introduced during said step of splitting the auxiliary signal.

* * * * *